United States Patent
Shi et al.

(10) Patent No.: US 9,383,640 B2
(45) Date of Patent: Jul. 5, 2016

(54) MASK PLATE AND METHOD FOR DETECTING EXPOSURE DEFECTS USING THE SAME

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Dawei Shi, Beijing (CN); Jian Guo, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 227 days.

(21) Appl. No.: 14/236,193

(22) PCT Filed: Dec. 11, 2013

(86) PCT No.: PCT/CN2013/089051
§ 371 (c)(1),
(2) Date: Jan. 30, 2014

(87) PCT Pub. No.: WO2014/206022
PCT Pub. Date: Dec. 31, 2014

(65) Prior Publication Data
US 2014/0377691 A1   Dec. 25, 2014

(30) Foreign Application Priority Data
Jun. 25, 2013 (CN) .......................... 2013 1 0256981

(51) Int. Cl.
G03F 1/38 (2012.01)
G03F 1/44 (2012.01)
G03F 7/40 (2006.01)

(52) U.S. Cl.
CPC ...... *G03F 1/44* (2013.01); *G03F 7/40* (2013.01)

(58) Field of Classification Search
CPC ..................................... G03F 1/38; G03F 1/44
See application file for complete search history.

(56) References Cited

U.S. PATENT DOCUMENTS

2011/0318673 A1   12/2011   Hung et al.

FOREIGN PATENT DOCUMENTS

| CN | 102193304 A | 9/2011 |
| CN | 102566322 A | 7/2012 |
| CN | 103324025 A | 9/2013 |

OTHER PUBLICATIONS

Second Chinese Office Action dated Feb. 25, 2015; Appln. No. 201310256981.1.
First Chinese Office Action dated Sep. 3, 2014; Appln. No. 201310256981.1.
International Search Report Issued Mar. 6, 2014; Appln. No. PCT/CN2012/089051.
International Preliminary Report on Patentability Appln. No. PCT/CN2013/089051; Dated Dec. 29, 2015.

*Primary Examiner* — Stephen Rosasco
(74) *Attorney, Agent, or Firm* — Ladas & Parry LLP

(57) ABSTRACT

Embodiments of the invention disclose a mask plate and a method for detecting an exposure defect using the mask plate. The mask includes a mask pattern, and the mask further includes a plurality of detection-mark mask patterns arranged along a scan direction of an exposure machine, the detection-mark mask patterns are arranged at an edge of the mask pattern. The detection-mark mask patterns are adapted for forming detection marks on a substrate. The detection marks are adapted for reflecting exposure defects of the exposure machine. With the mask plate of the invention, the reason for the exposure defect may be precisely decided, thereby improving the exposure effect and improving the parameter index of the substrate.

7 Claims, 3 Drawing Sheets

US 9,383,640 B2

MASK PLATE AND METHOD FOR DETECTING EXPOSURE DEFECTS USING THE SAME

FIELD OF THE ART

Embodiments of the present invention relate to a mask plate and a method for detecting exposure defects using the mask plate.

BACKGROUND

Since the photoelectric display technology has become more mature, the application fields of display devices become more widely. With the advantages of long lifetime, high optical efficiency, low radiation and low power consumption, Liquid Crystal Displays (LCDs) have recently become the mainstream development trend of display device products, gradually replacing conventional ray tube display devices.

The exposure machine as a regular equipment used in the fabrication process of the LCDs is principally configured for exposing the substrate, with an aim of transferring mask pattern information of the mask plate onto the substrate. After the exposure, subsequent processes such as developing and etching are used to form patterns of individual structural units required by the array substrate and the color film substrate in the LCD. The working procedure of the exposure machine is as follows: an arc beam (or beams in other forms) with an initial acceleration velocity of zero is emitted by the exposure machine; the beam is then accelerated though an acceleration region and used to scan the substrate with a uniform velocity, wherein the substrate is coated with a photosensitive substance thereon; and then the velocity of the beam is reduced to zero through a deceleration region and the exposure is finished. Herein the motion characteristics of the beam will have an influence on the exposure effect. For example, the motion characteristics of the beam comprise the scan velocity of the beam, the initial position and the ending position of the uniform scan and so on.

However, the inventors found that the conventional technology has at least the following disadvantages during research and development. That is, an exposure defect will occurs when the parameters of the exposure machine are not properly set. For example, instead of scanning and passing through the substrate with a uniform velocity, the beam emitted by the exposure machine scans and passes through the substrate in the acceleration or deceleration mode, which will cause the exposure amount received by the substrate different from the desired exposure amount. However, the reason for generating exposure defects can not be determined by using the existed detecting technology.

SUMMARY

Embodiments of the invention provide a mask plate and a method for detecting exposure defects using the mask plate, which may explicitly determine the reasons for the exposure defects, thereby improving the exposure effect and increasing the parameter indexes of the substrate.

An aspect of the embodiments of the present invention provides a mask plate, comprising a mask pattern, wherein the mask plate further comprises a plurality of detection-mark mask patterns arranged along a scan direction of an exposure machine. The detection-mark mask patterns are arranged at an edge of the mask pattern. The detection-mark mask patterns are used for forming detection marks on a substrate. The detection marks are used for reflecting exposure defects of the exposure machine.

Furthermore, a plurality of detection markers are arranged on the detection-mark mask patterns, and the detection markers comprise one or more types of digital markers, pattern markers, and alphabet markers.

Furthermore, the detection-mark mask patterns comprise one shape from a group consisting of a triangle, a circle, a square, and a rhombus.

Furthermore, the size of shape of the detection marks formed on the substrate by exposing and developing the detection-mark mask patterns is no smaller than a minimum size discernible by the exposure machine.

Furthermore, the detection-mark mask patterns each have the same shape.

Furthermore, the detection=mark mask patterns are arranged on the same side of the mask pattern.

Another aspect of the invention provides a method for detecting an exposure defect, comprising:
  exposing a substrate by using the above mask plate;
  developing the substrate after the exposing to obtain detection marks on the substrate; and
  detecting exposure defects present in the exposing according to the detection marks.

The mask plate and the method for detecting the exposure defects using the mask provided by the embodiments of the present invention arrange a plurality of detection-mark mask patterns along the scan direction of the exposure machine and form the detection marks on the substrate through the exposure and developing procedure, and then determine the exposure defect present in the exposure procedure according to deformation of the detection marks, thereby preventing the exposure defect from affecting the quality of the substrate and improving the parametric index of the substrate.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

Embodiments of the invention provides a mask plate and a method for detecting exposure defects using the mask plate, which may explicitly decide the reason for resulting in the exposure defects, thereby improving the exposure effects and increasing the parameter indexes of the substrate.

In the following description, technical details such as a specific system configuration, an interface and a technology are provided for illustrative and not limitative purpose so as to facilitate the understanding of the invention. However, it is understandable by those skilled in the art that the invention may be implemented by other embodiment without these details. In other circumstances, detailed descriptions of well-known devices, circuits and methods are omitted for the purpose of not obscuring the description of the invention.

An embodiment of the invention provides a mask plate which comprises a mask pattern, the mask plate further comprises a plurality of detection-mark mask patterns arranged along a scan direction of an exposure machine, and the detection-mark mask patterns are arranged at an edge of the mask pattern. The detection-mark mask patterns are adapted for forming detection marks on a substrate, and the detection marks are adapted for reflecting exposure defects of the exposure machine.

It should be explained that mask pattern information of the mask plate is transferred onto the substrate and corresponding patterns are formed through the exposure and developing processes. Therefore, the plurality of detection-mark mask patterns on the mask plate in accordance with the embodiment of the invention are also transferred onto the substrate to form a plurality of detection marks through the exposure and developing processes. It shows that the exposure machine has an exposure defect if a relatively large deformation between the detection marks and the detection-mark mask patterns occurs. When the detection-mark mask patterns are arranged along the scan direction of the exposure machine, the formed detection marks are also arranged along the scan direction of the exposure machine, the exposure defects present on the scan direction of the exposure machine can thus be decided. The detection-mark mask patterns are arranged at an edge of the mask patterns, with a purpose of preventing the detection marks formed by the detection-mark mask patterns from tainting the mask patterns on the substrate. Furthermore, when an exposure defect is detected, those skilled in the art may work out a solution according to the exposure defect to deal with the influence on substrate fabrication caused by the defect.

In the following, an example of an exposure procedure using a mask plate provided by an embodiment of the invention to expose a substrate will be described to help those skilled in the art to fully understand the embodiments of the invention.

Figure 1:
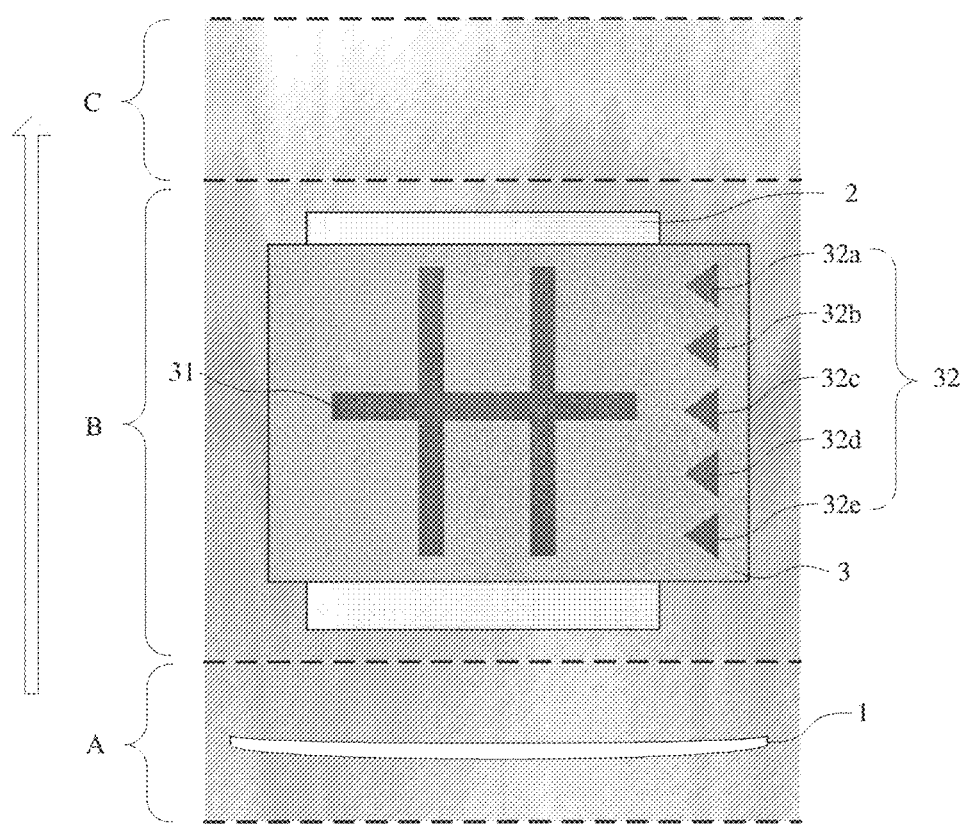
FIG. 1 schematically illustrates a first diagram of exposure using a mask plate provided by an embodiment of the present invention.

FIG. 1 schematically illustrates a diagram of exposing a substrate using a mask plate provided by an embodiment of the invention. As illustrated in FIG. 1, an exposure machine emits an arc beam 1. Of course, the beam emitted by the exposure machine may comprise beams of other forms. A substrate 2 to be exposed is fixed in the exposure machine, and a photosensitive substance is applied to the substrate 2. A mask plate 3 provided by the embodiment of the invention is placed above the substrate 2. The mask plate 3 comprises a mask pattern 31 and a plurality of detection-mark mask patterns 32 arranged along a scan direction of the exposure machine. The mask pattern 31 is adapted for forming patterns of structural units on the substrate, and the detection-mark mask patterns 32 are used to form detection marks on the substrate.

Furthermore, it is assumed that the arc beam 1 moves along the scan direction indicated by the arrow in FIG. 1 and scans the whole substrate 2. When the arc beam 1 finishes scanning the whole substrate 2, an exposure procedure for the substrate 2 is done. Based on the working principle of the exposure machine, the internal space of the exposure machine may be divided into three regions according to different motion characteristics of the beam emitted by the exposure machine, i.e., an acceleration region (as indicated by region A in FIG. 1), a uniform velocity region (as indicated by region B in FIG. 1) and a deceleration region (as indicated by region C in FIG. 1). The characteristics of the three regions are as follows. In the acceleration region, the beam emitted by the exposure machine moves faster and faster; in the deceleration region, the beam emitted by the exposure machine moves slower and slower; and in the uniform velocity region, the beam emitted by the exposure machine moves with a constant velocity. In fact, for the purpose of achieving a better exposure effect such that the substrate receive an optimal exposure amount, the parameter settings of the exposure machine should be adjusted, and the position of the substrate should be adjusted such that the substrate is positioned in the uniform velocity region.

In order to detect whether there is an exposure defect in the exposure machine and to decide the specific reason for the exposure defect, a plurality of detection-mark mask patterns are arranged along the scan direction of the exposure machine in the embodiment of the invention and the detection-mark mask patterns are arranged at an edge of the mask pattern. For example, as illustrated in FIG. 1, the mask plate 3 comprises five detection-mark mask patterns 32 that are arranged along the scan direction of the exposure machine. The detection-mark mask patterns 32 are arranged at the edge of the mask pattern 31 and are triangle-shaped, which are respectively the detection-mark mask patterns 32a, 32b, 32c, 32d and 32e from top to bottom. After the exposure procedure, the substrate 2 is subsequently developed. Patterns of the detection marks corresponding to the detection-mark mask patterns 32 will be formed on the substrate 2. For the convenience of description, the detection mark formed by developing the detection-mark mask pattern 32a is designated as a', the detection mark formed by developing the detection-mark mask pattern 32b is designated as b', the detection mark formed by developing the detection-mark mask pattern 32c is designated as c', the detection mark formed by developing the detection-mark mask pattern 32d is designated as d', and the detection mark formed by developing the detection-mark mask pattern 32e is designated as e'.

Three instances after the exposure and developing procedures will be described as follows.

Figure 2:
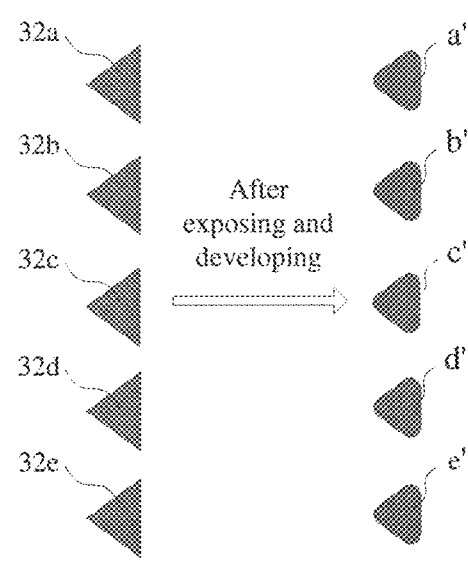
FIG. 2 schematically illustrates a first diagram showing a correspondence relationship between detection-mark mask patterns and detection marks of an embodiment of the invention.
Figure 3:
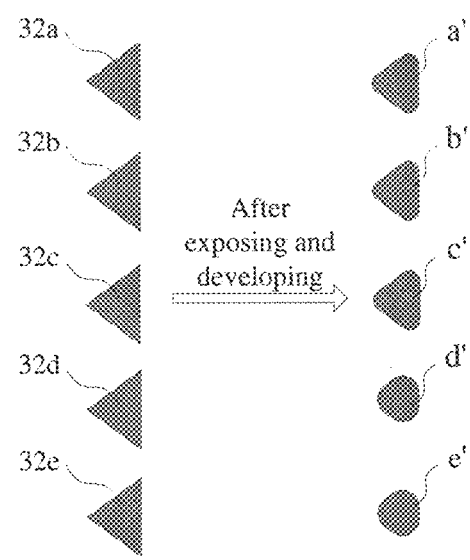
FIG. 3 schematically illustrates a second diagram showing a correspondence relationship between detection-mark mask patterns and detection marks of an embodiment of the invention.

1. The relationship between the detection-mark mask patterns and the detection marks which are formed after the developing procedure is shown in FIG. 2.

In this case, the detection-mark mask patterns and the detection marks formed after the developing procedure have very similar shape and little difference. It should be explained that, as the exposure procedure transfers the information of the mask patterns on the mask plate to the substrate, it shows that the exposure amount is appropriate when the mask patterns and the patterns formed on the substrate are very similar. Accordingly, it means that the used exposure parameters and the position of the substrate can meet the requirement and there is no exposure defect. For example, as illustrated in FIG. 1, the substrate is positioned in the uniform velocity regions B. Correspondingly, the mask plate 3 is also positioned in the uniform velocity regions B and the detection-mark mask patterns 32 have received beams with a suitable exposure amount.

It should be explained, those skilled in the art can easily understand that the difference between the shape of the detection-mark mask patterns and that of the detection marks may be observed via a microscope or may be simulated using related software, which will not be elaborated here. Furthermore, the shape and numbers of the detection-mark mask patterns as described in the embodiment of the invention are only for illustrative purpose. In fact, those skilled in the art may change the shape and numbers as required.

2. The relationship between the detection-mark mask patterns and the detection marks which are formed after the developing procedure is shown in FIG. 2.

Figure 4:
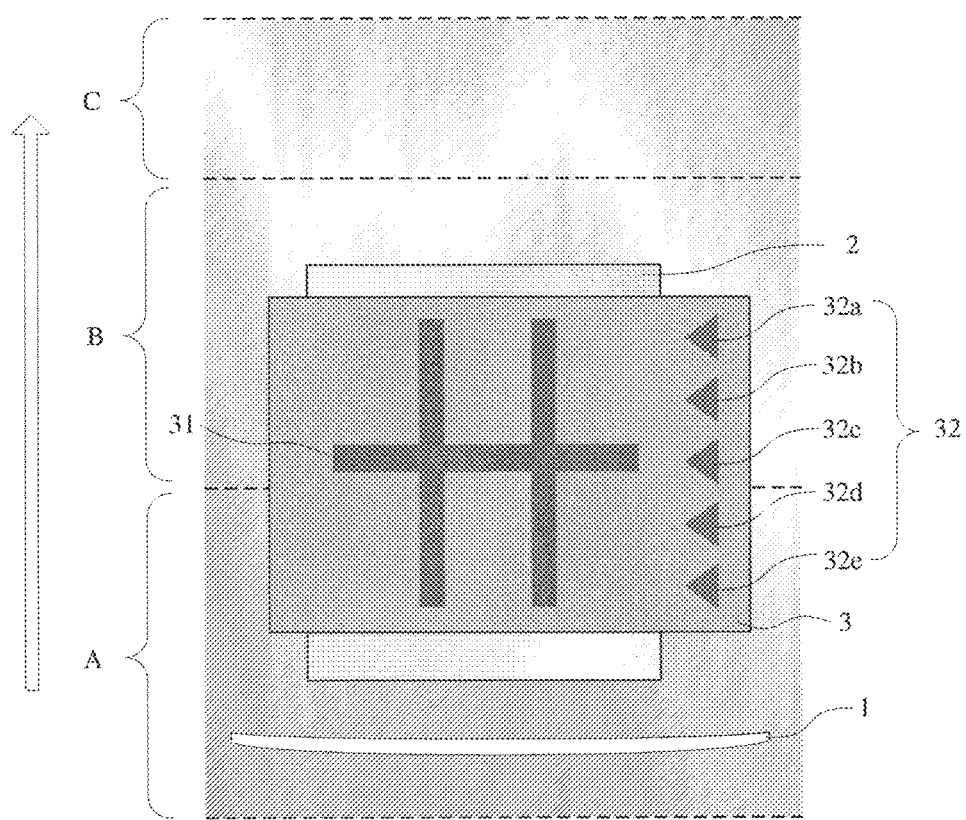
FIG. 4 schematically illustrates a second diagram of exposure using a mask plate provided by an embodiment of the invention.

In this case, the detection-mark mask pattern 32a and the detection mark a' have similar shapes, the detection-mark mask pattern 32b and the detection mark b' have similar shape, and the detection-mark mask pattern 32c and the detection-mark c' have similar shape. However, the shape of the detection-mark mask pattern 32d is quite different from that of the detection-mark d', and the shape of the detection-mark mask pattern 32e is quite different from the detection-mark e'. It thus shows that the substrate has received unusual amounts of exposure in the positions corresponding to the detection-mark mask patterns 32d and 32e, and thus has the issue of unusual exposure. The possible exposure defect can be analyzed in view of the working manner of the exposure machine. For example, as illustrated in FIG. 4, the detection-mark mask patterns 32a, 32b and 32c of the detection-mark mask patterns 32 on the mask 3 are positioned in the uniform velocity region B, while the detection-mark mask patterns 32d and 32e are positioned in the acceleration region A. The beam of the exposure machine is in an accelerating motion state in the acceleration region A, and thus has a smaller velocity in the accelerating motion state in comparison with the uniform motion state. As a result, when the substrate 2 is scanned, the exposure time is too long, the substrate will therefore receive an exposure amount different from the designed amount, which will eventually cause the difference between the detection-mark mask patterns and the detection marks formed after the developing procedure and the exposure procedure.

It is understandable that those skilled in the art can find the reason for the exposure defect based on the difference between the shape of the detection-mark mask patterns and the shape of the detection marks. For example, as illustrated in FIG. 4, the reason for the current exposure defect is that one part of the substrate is in the uniform velocity region and another part is in the acceleration region. Thereafter, those skilled in the art can adjust the technical attributes of the exposure procedure according to the exposure defect. For example, the position of the substrate or the corresponding control parameters of the exposure machine can be adjusted so as to resolve the exposure defect.

Figure 5:
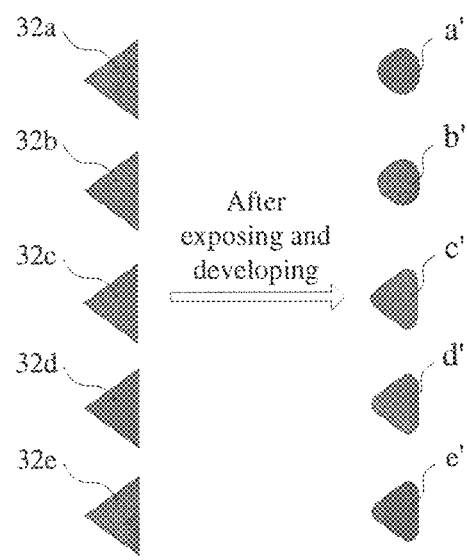
FIG. 5 schematically illustrates a third diagram showing a correspondence relationship between detection-mark mask patterns and detection marks of an embodiment of the invention.

3. The relationship between the detection-mark mask patterns and the detection marks which are formed after the developing procedure is shown in FIG. 5.

Figure 6:
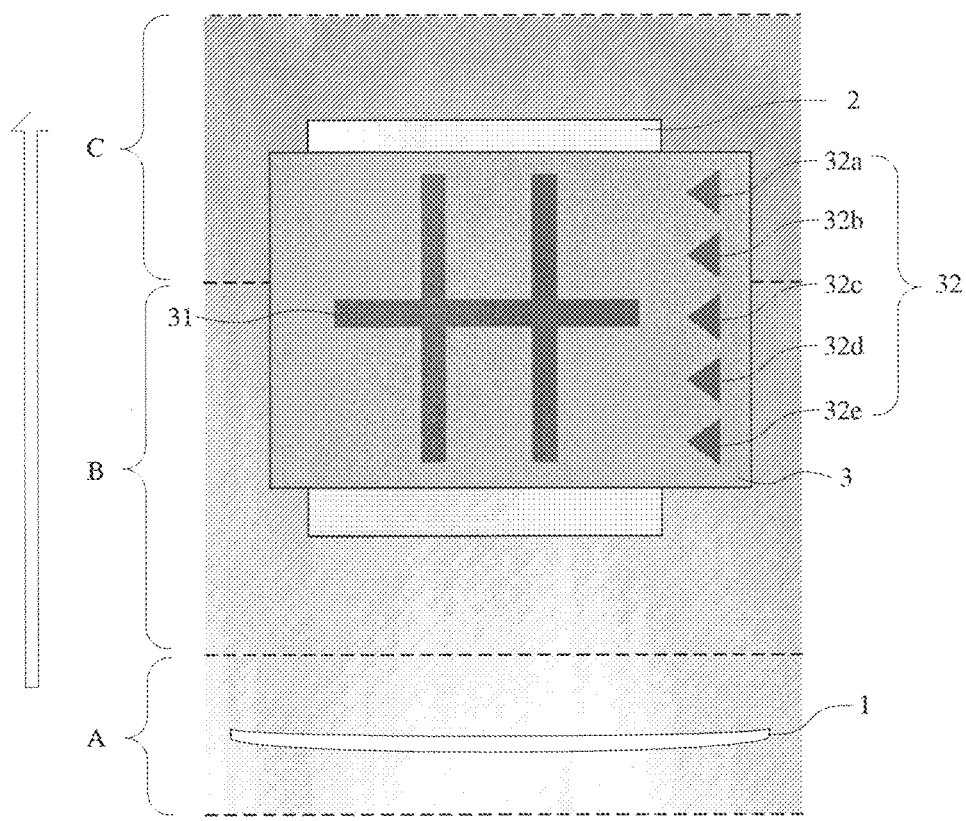
FIG. 6 schematically illustrates a third diagram of exposure using a mask plate provided by an embodiment of the invention.

In this case, the detection-mark mask pattern 32c and the detection mark c' have similar shape, the detection-mark mask pattern 32d and the detection mark d' have similar shape, and the detection-mark mask pattern 32e and the detection mark e' have similar shape. However, the shape of the detection-mark mask pattern 32a is quite different from that of the detection mark a', and the shape of the detection-mark mask pattern 32b is quite different from that of the detection mark b'. It thus shows that the substrate has received unusual amounts of exposure in the positions corresponding to the detection-mark mask patterns 32a and 32b, and thus has the issue of unusual exposure. The possible exposure defect can be analyzed in view of the working manner of the exposure machine. For example, as illustrated in FIG. 6, the detection-mark mask patterns 32c, 32d and 32e of the detection-mark mask patterns 32 on the mask plate 3 are positioned in the uniform velocity region B, while the detection-mark mask patterns 32a and 32b are positioned in the deceleration region C. The beam of the exposure machine is in a decelerating motion state in the deceleration region C, and thus has a smaller velocity in the decelerating motion state in comparison with the uniform motion state. As a result, when the substrate is scanned, the exposure time is too long, the substrate will therefore receive an exposure amount different from the designed amount, which will eventually causes the difference between the detection-mark mask patterns and the detection marks formed after the developing procedure and the exposure procedure.

It is understandable that those skilled in the art can find the reason for the exposure defect based on the difference between the shape of the detection-mark mask patterns and the shape of the detection marks. For example, as illustrated in FIG. 5, the reason for the current exposure defect is that one part of the substrate is in the uniform velocity region and another part is in the deceleration region. Thereafter, those skilled in the art can adjust the technical attributes of the exposure process according to the exposure defect. For example, the position of the substrate or the corresponding control parameters of the exposure machine can be adjusted so as to resolve the exposure defect.

In summarizing the procedure of analyzing the three exposure defects, it can be found that a plurality of detection-mark mask patterns arranged along the scan direction of the exposure machine and at the edge of the mask pattern are disposed on the substrate provided by the embodiments of the invention, and detection marks will be formed on the substrate after the detection mark-mask patterns are exposed and developed. The exposure defect present in the exposure procedure can be decided according to the deformation of the detection marks, and the exposure machine may be adjusted accordingly to overcome the influence of the exposure defect on the quality of the substrate.

It has to be further noted that the embodiments of the invention only provide three possible situations that may occur during the exposure procedure and find out which kind of the exposure defects leads to the situations. In fact, there are many other possible exposure defects that can be reflected by different deformations of the detection marks, which will not be elaborated here. However, it can be understandable by those skilled in the art that the exposure defects present in the exposure machine may be reflected by the detection marks formed on the substrate after the exposure procedure and developing procedure for the detection-mark mask patterns that are arranged along the scan direction of the exposure machine and at the edge of the mask pattern on the mask plate.

Furthermore, a plurality of detection markers are arranged on the detection-mark mask patterns, the detection markers comprise one or more kinds of digital markers, pattern markers, and alphabet markers. It is understandable that it may determine the deformation between the detection-mark mask patterns and the detection mark in a better and more accurate way to facilitate the analysis of the exposure defect.

Similarly, the detection-mark mask patterns may have many shapes. For example, a shape of the detection-mark mask patterns may include any of a triangle, a circle, a square, and a rhombus.

Furthermore, the size of the shape of the detection marks formed by exposing and developing the detection-mark mask patterns is no smaller than a minimum size of shape that can be discernible by the exposure machine.

Furthermore, the detection-mark mask patterns each have the same shape.

Furthermore, the detection-mark mask patterns are arranged on the same side of the mask pattern.

The embodiment of the invention provides a mask plate, wherein the plurality of detection-mark mask patterns arranged along the scan direction of the exposure machine and arranged at an edge of the mask pattern are disposed on the mask plate and for forming detection marks on the substrate after the exposure and developing procedure. The exposure defect present in the exposure procedure is determined according to the deformation of the detection marks, thereby avoiding the influence on the quality of the substrate by the exposure defect and accordingly improving the parametric index of the substrate.

Furthermore, an embodiment of the invention further provides a method for detecting an exposure defect, comprising:

1) Exposing a substrate by using the above mask plate.

Specifically, the mask plate comprises a mask pattern, and the mask plate further comprises a plurality of detection-mark mask patterns arranged along a scan direction of an exposure machine and at an edge of the mask pattern.

2) Developing the substrate after the exposing procedure to obtain detection marks on the substrate.

Specifically, the detection-mark mask patterns will form detection marks on the substrate after the exposing procedure and the developing procedures, and the detection marks can reflect the exposure defect of the exposure machine.

3) Detecting the exposure defect present in the exposing procedure according to the detection marks.

Specifically, the detection marks are formed on the substrate by exposing and developing the detection-mark mask patterns. Therefore, if the detection marks are deformed, it shows that exposure defects occur in the exposure procedure, and corresponding solutions may be worked out according to the exposure defect to deal with the influence on the substrate fabrication by the defect.

Herein, the method for detecting the exposure defect as provided by the embodiment of the invention may be realized with reference to the above embodiment, which will not be elaborated here.

The embodiment of the invention provides a method for detecting an exposure defect, wherein a plurality of detection-mark mask patterns arranged along a scan direction of an exposure machine and at an edge of the mask pattern are disposed on the mask plate and for forming detection marks on the substrate after the exposing procedure and developing procedure. The exposure defect present in the exposure procedure is determined by detecting the deformation of the detection marks, thereby avoiding the influence on the quality of the substrate by the exposure defect and accordingly improving the parameter index of the substrate.

What are described above is related to the illustrative embodiments of the disclosure only and not limitative to the scope of the disclosure; the scopes of the disclosure are defined by the accompanying claims.

What is claimed is:

1. A mask plate, comprising a mask pattern and a plurality of detection-mark mask patterns arranged along a scan direction of an exposure machine, the detection-mark mask patterns are arranged at an edge of the mask pattern, the detection-mark mask patterns are used for forming detection marks on a substrate, the detection marks are used for reflecting exposure defects caused by a beam emitted from the exposure machine scanning and passing through the substrate with a nonuniform velocity.

2. The mask plate of claim 1, wherein a plurality of detection markers are arranged on the detection-mark mask patterns, the detection markers comprise one or more types of digital markers, pattern markers, and alphabet markers.

3. The mask plate of claim 1, wherein the detection-mark mask patterns comprises one shape from a group consisting of a triangle, a circle, a square, and a rhombus.

4. The mask plate of any of claim 3, wherein a size of the shape of the detection marks formed on the substrate by exposing and developing the detection-mark mask patterns is no smaller than a minimum size that can be discernable by the exposure machine.

5. The mask plate of any of claim 1, wherein the detection-mark mask patterns each have the same shape.

6. The mask plate of any of claim 1, wherein the detection-mark mask patterns are arranged on the same side of the mask pattern.

7. A method for detecting an exposure defect comprising:
exposing a substrate by using the mask plate of any of claim 1;
developing the substrate after the exposing to obtain detection marks on the substrate; and
detecting exposure defects present in the exposing caused by a beam emitted from the exposure machine scanning and passing through the substrate with a nonuniform velocity, according to the detection marks.

* * * * *